United States Patent [19]

Wehrli

[11] Patent Number: 4,587,489
[45] Date of Patent: May 6, 1986

[54] METHOD FOR RAPID ACQUISITION OF NMR DATA

[75] Inventor: Felix W. Wehrli, Shorewood, Wis.

[73] Assignee: General Electric Company, Milwaukee, Wis.

[21] Appl. No.: 539,780

[22] Filed: Oct. 7, 1983

[51] Int. Cl.⁴ ............................................. G01R 33/20
[52] U.S. Cl. ..................................... 324/309; 324/307
[58] Field of Search ............... 324/300, 307, 309, 311, 324/312, 313

[56] References Cited

U.S. PATENT DOCUMENTS 4,115,730 9/1978 Mansfield ............................ 324/309
4,484,138 11/1984 Bottomley .......................... 324/309

Primary Examiner—Michael J. Tokar
Attorney, Agent, or Firm—Alexander M. Gerasimow; Douglas E. Stoner

[57] ABSTRACT

A method for rapid acquisition of NMR data utilizes excitation pulses which rotate the longitudinal magnetization through an angle smaller than 90° to create a relatively large transverse magnetization component. A first 180° RF pulse is then applied to create a spin-echo signal, while a second 180° RF pulse is used to rapidly return to equilibrium the residual longitudinal magnetization inverted by the first pulse. The combination of the excitation and the second 180° pulses permits the sequence repetition time to be shortened, thereby reducing the total data collection time. The method is applicable to, for example, two- and three-dimensional embodiments of Fourier transform and multiple-angle projection reconstruction NMR imaging methods.

20 Claims, 7 Drawing Figures

METHOD FOR RAPID ACQUISITION OF NMR DATA

BACKGROUND OF THE INVENTION

This invention relates to methods utilizing nuclear magnetic resonance (NMR) techniques for studying an object. In particular, this invention relates to two- and three-dimensional rapid NMR data acquisition schemes, useful in but not limited to NMR imaging.

By way of background, the nuclear magnetic resonance phenomenon occurs in atomic nuclei having an odd number of protons and/or neutrons. Due to the spin of the protons and the neutrons, each such nucleus exhibits a magnetic moment, such that, when a sample composed of such nuclei is placed in a static, homogeneous magnetic field, $B_0$, a greater number of nuclear magnetic moments align with the field to produce a net macroscopic magnetization M in the direction of the field. Under the influence of magnetic field $B_0$, the magnetic moments precess about the field axis at a frequency which is dependent on the strength of the applied magnetic field and on the characteristics of the nuclei. The angular precession frequency, $\omega$, also referred to as the Larmor frequency, is given by the equation $\omega = \gamma B$, in which $\gamma$ is the gyromagnetic ratio which is constant for each NMR isotope and wherein B is the magnetic field (including $B_0$) acting upon the nuclear spins. It will be thus apparent that the resonant frequency is dependent on the strength of the magnetic field in which the sample is positioned.

The orientation of magnetization M, normally directed along the magnetic field $B_0$, may be perturbed by the application of magnetic fields oscillating at the Larmor frequency. Typically, such magnetic fields designated $B_1$ are applied orthogonally to the direction of the static magnetic field by means of a radio frequency (RF) pulse through coils connected to a radio-frequency-transmitting apparatus. The effect of field $B_1$ is to rotate magnetization M about the direction of the $B_1$ field. This may be best visualized if the motion of magnetization M due to the application of RF pulses is considered in a Cartesian coordinate system which rotates (rotating frame) at a frequency substantially equal to the resonant frequency $\omega$ about the main magnetic field $B_0$ in the same direction in which the magnetization M precesses. In this case, the $B_0$ field is chosen to be directed in the positive direction of the Z-axis, which, in the rotating frame, is designated Z' to distinguish it from the fixed-coordinate system. Similarly, the X- and Y-axes are designated X' and Y'. Bearing this in mind, the effect of an RF pulse, then, is to rotate magnetization M, for example, from its direction along the positive Z' axis toward the transverse plane defined by the X' and Y' axes. An RF pulse having either sufficient magnitude or duration to rotate (flip) magnetization M into the transverse plane (i.e., 90° from the direction of the $B_0$ field) is conveniently referred to as a 90° RF pulse. Similarly (in the case of a rectangular pulse), if either the magnitude or the duration of an RF pulse is selected to be twice that of a 90° pulse, magnetization M will change direction from the positive Z' axis to the negative Z' axis. This kind of an RF pulse is referred to as a 180° RF pulse, or for obvious reasons, as an inverting pulse. It should be noted that a 90° or a 180° RF pulse (provided it is applied orthogonal to M) will rotate magnetization M through the corresponding number of degrees from any initial direction of magnetization M. It should be further noted that an NMR signal will only be observed if magnetization M has a net transverse component (perpendicular to $B_0$) in the X'-Y' (transverse) plane. A 90° RF pulse produces maximum net transverse magnetization in the transverse plane since all the magnetization M is in that plane, while a 180° RF pulse does not produce any transverse magnetization.

RF pulses may be selective or nonselective. Selective pulses are typically modulated to have a predetermined frequency content so as to excite nuclear spins situated in preselected regions of the sample having magnetic-field strengths as predicted by the Larmor equation. The selective pulses are applied in the presence of localizing magnetic-field gradients. Nonselective pulses generally affect all of the nuclear spins situated within the field of the RF pulse transmitter coil and are typically applied in the absence of localizing magnetic-field gradients.

There are two exponential time constants associated with longitudinal and transverse magnetizations. The time constants characterize the rate of return to equilibrium of these magnetization components following the application of perturbing RF pulses. The first time constant is referred to as the spin-lattice relaxation time ($T_1$) and is the constant for the longitudinal magnetization to return to its equilibrium value. For biological tissue, $T_1$ values range between 200 milliseconds and 1 second. A typical value is about 400 milliseconds. Spin-spin relaxation time ($T_2$) is the constant for the transverse magnetization to return to its equilibrium value in a perfectly homogeneous field $B_0$. $T_2$ is always less than $T_1$ and in biological tissue, the range is between about 50 to 150 milliseconds. In fields having inhomogeneities, the time constant for transverse magnetization is governed by a constant denoted $T_2^*$, with $T_2^*$ being less than $T_2$.

There remains to be considered the use of magnetic-field gradients to encode spatial information (used to reconstruct images, for example) into NMR signals. Typically, three such gradients are necessary:

$$G_x(t) = \partial B_0/\partial x,$$

$$G_y(t) = \partial B_0/\partial y, \text{ and}$$

$$G_z(t) = \partial B_0/\partial z.$$

The $G_x$, $G_y$, and $G_z$ gradients are constant throughout the imaging slice, but their magnitudes are typically time dependent. The magnetic fields associated with the gradients are denoted, respectively, $b_x$, $b_y$, and $b_z$, wherein $$b_x = G_x(t)x,$$

$$b_y = G_y(t)y,$$

$$b_z = G_z(t)z,$$

within the volume.

In the past, the NMR phenomenon has been utilized by structural chemists to study in vitro the molecular structure of organic molecules. More recently, NMR has been developed into an imaging modality utilized to obtain images of anatomical features of live human subjects, for example. Such images depicting nuclear-spin distribution (typically protons associated with water in tissue), spin lattice ($T_1$), and/or spin-spin ($T_2$) relaxation constants are believed to be of medical diagnostic value in determining the state of health of tissue in the region examined. Imaging data for reconstructing NMR images is collected by subjecting the sample to pulse sequences comprises of magnetic-field gradients and RF pulses. A drawback associated with some data acquisition schemes is the prohibitively long scan time needed to acquire the necessary data. Efforts to reduce the total acquisition time by lowering the repetition time ($T_r$) between pulse sequences is limited by the finite relaxation times which, in biological tissues, typically range from 200–600 millisec. Stated differently, the nuclear spins are progressively saturated as the repetition time is shortened. Saturation is a non-equilibrium state in which equal numbers of nuclear spins are aligned against and with magnetic field $B_0$, so that there is no net magnetization M. Thus, it will be recognized that under conditions of saturation, nuclear spins cannot be excited to produce an NMR signal. It is, therefore, a principal object of the present invention to provide an NMR data acquisition scheme which is capable of rapidly collecting the data necessary for reconstructing NMR images, for example.

SUMMARY OF THE INVENTION

In accordance with the invention, an NMR method is provided for shortening the total NMR data acquisition time. The sample is positioned in a homogeneous magnetic field so as to create, in at least a portion thereof, a longitudinal magnetization directed along the field. An RF pulse is then used to irradiate the sample to convert a fraction, but not all, of the longitudinal magnetization to transverse magnetization. The direction of dephasing of the transverse magnetization is reversed to produce a spin-echo signal which is sampled to derive, upon analysis, the NMR data. To shorten the total data collection time, a 180° RF pulse is applied following the data collection interval to rapidly return to equilibrium (along the homogeneous field) any remaining inverted longitudinal magnetization.

BRIEF DESCRIPTION OF THE DRAWINGS

The features of the invention believed to be novel are set forth with particularly in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Initially, it will be beneficial to the understanding of the present invention to consider that in conventional NMR imaging schemes a 90° RF pulse is utilized to create a transverse magnetization which produces the NMR signal as the nuclei realign themselves with the $B_0$ field. As described hereinbefore, a 90° RF pulse produces a maximum net transverse magnetization since all of the magnetization is rotated into the transverse plane. The resulting NMR signal has a maximum amplitude corresponding to the maximum value of the transverse magnetization. In some NMR data acquisition schemes, such as three-dimensional imaging in which data is collected from a larger volume to subsequently reconstruct a series of tomographic images, a very high signal-to-noise ratio is attained. In fact, the achieved signal-to-noise ratio exceeds that practically necessary for constructing good quality images.

The use of 90° RF excitation pulses, however, is not compulsory. Ernst and Anderson (Review Scientific Instruments, Vol. 37, pg. 93, 1966) have recognized in the context of structural analytical NMR spectroscopy that pulses which rotate magnetization through a smaller angle than 90° may also be utilized. They have shown that for a train of repetitive excitation pulses the optimum rotation angle is given by $$\cos \theta = \exp(-T_r/T_1), \qquad (1)$$

wherein $T_r$ is the sequence repetition time, and $T_1$ is the spin-lattice relaxation time.

Figure 1A:
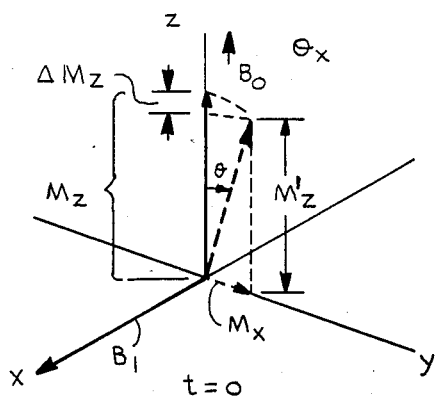
FIGS. 1a–1d depict schematically various orientations of magnetization M corresponding to various stages of excitation in accordance with the invention.

Referring now to FIG. 1a, it will be seen that the application of an RF magnetic field $B_1$ in the positive X-axis direction will rotate magnetization $M_z$, pointed in the direction of the positive Z axis which is also the direction of the $B_0$ magnetic field, by an angle $\theta$ to produce in the X-Y plane a transverse magnetization component designated $M_x$. The magnitude of transverse magnetization $M_x$ is given by $M_z \sin \theta$, while the loss in longitudinal magnetization $\Delta M_z$ is given by $M_z(1-\cos \theta)$. Hence, for small angles $\theta$ (much less than 90°), $\Delta M_z$ is much less than $M_x$. That is, a relatively large transverse magnetization is created at the expense of only small loss of longitudinal magnetization.

Figure 1B:
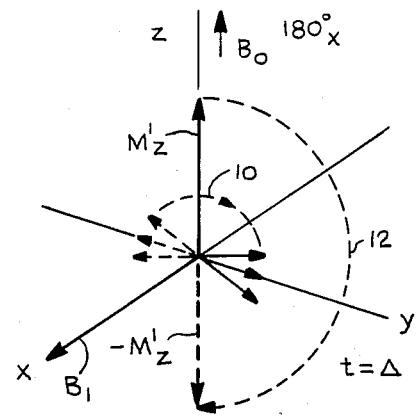

It is further beneficial to the understanding of the invention to note that most NMR imaging schemes rely on the collection of a spin-echo signal following the application of a nonselective 180° RF pulse, rather than the free-induction-decay (FID) signal. This is due to the fact that the FID signal occurs immediately upon the termination of the RF excitation pulse at a time when magnetic-field gradients utilized in the selective excitation process and magnetic-field gradients utilized to encode spatial information into the NMR signal are transient (e.g., being turned off and on). Thus, during this period, spatial information is badly distorted and the NMR signal cannot be normally used. The effect of the nonselective 180° pulse is, however, not only to reverse (as suggested by arrow 10, FIG. 1b) the direction of spin dephasing to produce a spin-echo signal (FIG. 1c), but the large residual magnetization, $M'_z$, following the RF excitation pulse is converted (as suggested by arrow 12, FIG. 1b) to a negative magnetization, $-M'_z$, thereby establishing an undesired, non-equilibrium state. The reason the negative longitudinal magnetization is undesired is that, prior to reapplication of the excitation pulse in a subsequent repetition of the imaging sequence, this magnetization must be allowed to return to equilibrium along the positive Z-axis. This return to equilibrium takes place with a $T_1$ time constant and is time consuming, thereby increasing the total data collection time.

Figure 1C:
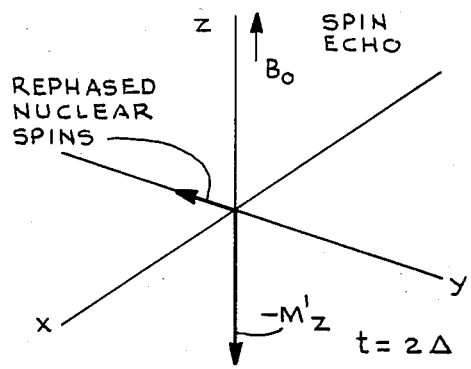
Figure 1D:
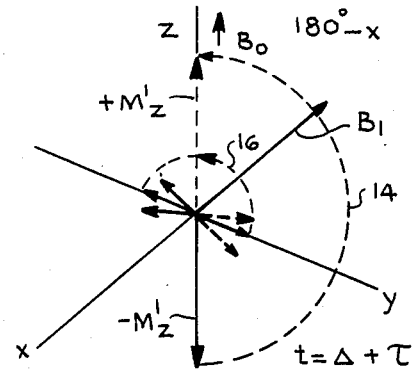

In accordance with the invention, the total data acquisition time is reduced by the use of excitation pulses which rotate magnetization $M_z$ through an angle, $\theta_x$, less than 90°, and by the application of a second 180° nonselective RF pulse following the occurrence of the spin-echo signal, therefore, reestablishing positive $M_z$ magnetization close to its equilibrium value as indicated by arrow 14 in FIG. 1d. The use of the second 180° RF pulse to reestablish equilibrium of longitudinal magnetization has the advantage that the transverse magnetization is not reduced by $T_2$ decay which is severe in biological tissues, since $T_2$ is much less than $T_1$. At the same time, the second 180° RF pulse will again reverse (arrow 16, FIG. 1d) the direction of nuclear spin dephasing so as to induce another spin-echo signal which may or may not be sampled. It may be desirable, for example, to sample this spin-echo signal to derive $T_2$ information from the region examined in a manner well known to those skilled in the art. Alternatively, the two spin-echo signals could be averaged for the purpose of increasing the signal-to-noise ratio.

Figure 2:
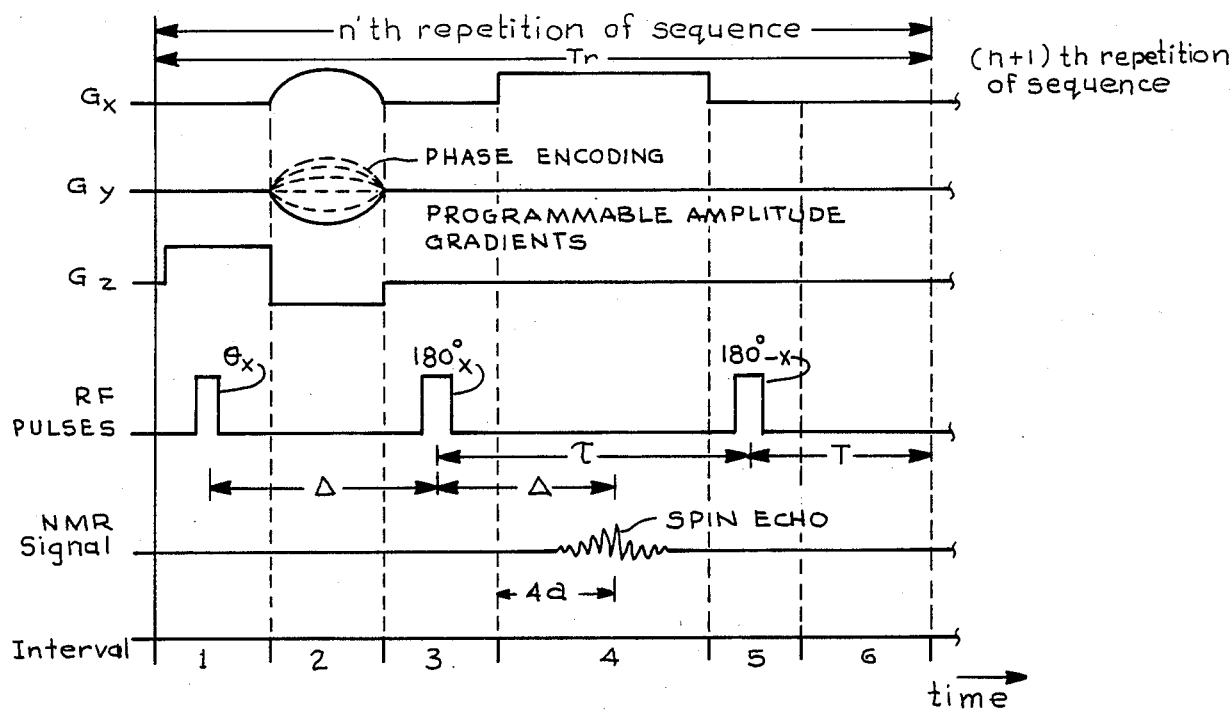
FIG. 2 depicts one exemplary embodiment of the present invention as applied to a two-dimensional Fourier transform pulse sequence commonly referred to as the spin-warp sequence.

FIG. 2 depicts one exemplary embodiment of the invention in the context of the n'th repetition of a two-dimensional spin-warp imaging pulse sequence. Spin-warp is an example of a Fourier transform imaging method. The conventional pulse sequence is described, for example, in Kaufman et al Eds "Nuclear Magnetic Resonance Imaging in Medicine," Igahu-Shoin Publishers, 1981.

Referring now to FIG. 2, it will be seen that in interval 1, indicated along the horizontal axis, a positive $G_z$ gradient pulse is applied. The direction of the $G_z$ gradient is arbitrarily selected to be in the positive Z-axis direction of the Cartesian coordinate system and coincides with the direction of the $B_0$ magnetic field. The $B_0$ field is not shown in this or other Figures depicting pulse sequences, since it is applied continuously during NMR experiments. Also, in interval 1, a selective RF pulse $\theta_x$ is applied in the presence of the $G_z$ gradient so as to excite nuclear spins in a predetermined region of a sample (not shown). In this embodiment, the region is selected to be a narrow slice. The RF pulsse may be modulated by a sinc function (sin x/x) so as to preferentially excite nuclear spins in an imaging slice having a substantially rectangular profile. In the inventive pulse sequence, the degree of rotation imparted by this excitation pulse is less than the conventional 90° RF pulse. The degree of rotation is selected with reference to Equation 1. It will be seen with reference to FIG. 1a that a small rotation (about the direction of the $B_1$ field produced by the RF pulse) of longitudinal magnetization $M_z$ through angle $\theta$ creates a relatively large transverse magnetization component $M_x$, with only a comparatively small decrease ($\Delta M_z$) in the amplitude of $M_z$. There remains a large residual longitudinal magnetization component $M'_z$ pointed along the direction of field $B_0$.

When the positive $G_z$ gradient is turned off at the end of interval 1, the excited spins precess at the same frequency but are out of phase with one another due to the dephasing effect of the gradient. The nuclear spins are rephased by the application in interval 2 of a negative $G_z$ gradient pulse. Typically, the time integral of the waveform of the $G_z$ gradient over interval 2 required to rephase the spins is approximately equal to the negative one half of the time integral of the positive $G_z$ gradient waveform in interval 1. During interval 3, a phase-encoding $G_y$ gradient is applied simultaneously with the application of a pulsed $G_x$ gradient. The $G_y$ gradient has a single, peak amplitude in the nth repetition of the sequence comprising intervals 1-6. Howver, in each successive application, such as the (n+1)th repetition of the sequence, a different amplitude of the phase-encoding gradient is selected. The $G_y$ gradient encodes spatial information in the Y-axis direction by introducing a twist in the orientation of the transverse magnetization by a multiple of $2\pi$ in the Y-axis direction. Following the application of the first phase-encoding gradient, the transverse magnetization is twisted into a one-turn helix. Each different amplitude of the $G_y$ gradient introduces a different degree of twist (phase encoding). The number of $G_y$ gradient amplitudes is chosen to be equal to the number of pixels (typically 128 or 256) the reconstructed image will have in the Y-axis direction. It should be noted that, in some embodiments, it may be advantageous to repeat the pulse sequence prior to advancing the amplitude of the gradient to improve the S/N ratio by averaging the NMR signals.

Referring again to FIG. 2, the effect of the $G_x$ gradient in interval 2 is to dephase the nuclear spins by a predetermined amount such that, when a first nonselective 180° RF pulse is applied in interval 3 a spin-echo signal will be produced in interval 4. The 180° RF pulse is typically applied at a time $\Delta$ following the mean application of the selective RF pulse in interval 1. The 180° pulse inverts the direction of nuclear spin dephasing as indicated by arrow 10 in FIG. 1b. The nuclear spins then rephase under the influence of the $G_x$ gradient in interval 4 to produce a maximum in the spin-echo signal amplitude at the same time $\Delta$ following the 180° pulse (provided gradients $G_x$ are selected to have equal time integrals in intervals 2 and 4a). Spatial information is encoded in the X-axis direction by the linear $G_x$ gradient in interval 4 by causing the nuclear spins to resonate at frequencies characteristic of their locations with respect to the X-axis. The spin-echo signal is sampled in interval 4 a number of times which is typically equal to the number of pixels (typically 128 or 256) the reconstructed image will have in the X-axis direction. The image pixel values are obtained from the sample signals using a two-dimensional Fourier transform as disclosed, for example, by Kumar et al in *J.Mag. Res.*, Vol. 18, p. 69 (1975).

As a result of the 180° RF pulse in interval 3, residual longitudinal magnetization $M'_z$ is inverted by 180° (as indicated by arrow 12, FIG. 1b) and appears as a negative ($-M'_z$) component directed in the negative Z-axis direction (FIG. 1c). In the conventional pulse sequence, $-M'_z$ is allowed to return to equilibrium (along positive Z-axis) by the $T_1$ relaxation process in interval 6 of FIG. 2 before the pulse sequence can be repeated. This, however, unnecessarily prolongs the data acquisition process.

In accordance with the invention, a second nonselective 180° RF pulse is applied (at a time $\tau$ following the mean application of the first 180° pulse) in interval 5 (FIG. 2) to rapidly restore $M_z$ to its equilibrium position along the positive Z-axis as indicated by arrow 14 in FIG. 1d. In order to maintain a high value of longitudinal magnetization along the positive Z axis, data collection period 4 should be kept short (not much longer than required for sampling the spin-echo signal, i.e., 5-10 ms). In the inventive sequence, period 6 constitutes the bulk of the time between consecutive repetitions of the pulse sequence. Since most of the longitudinal magnetization is returned to a positive value of the longitudinal magnetization by the second 180° pulse, interval 6 is shorter than in a conventional pulse sequence.

The steady-state magnetization $M_z$ that has built up at the end of interval 6 can be shown to be $$M_Z = M_o \frac{1 - 2e^{-T/T1} + 2e^{-(\tau+T)/T1} - e^{-Tr/T1}}{1 - \cos\theta e^{-Tr/T1}}, \quad (2)$$

in which $M_o$ is the equilibrium magnetization, and
T is the time between the mean application of the second 180° pulse and the end of interval 6.

The RF pulse $\theta_x$ in interval 1 of FIG. 2 which rotates magnetization $M_z$ through an angle $\theta$ generates transverse magnetization $$M_x = M_z \sin \theta, \quad (3)$$

which can be compared with that of a conventional partial saturation sequence where $$M_x = M_o(1 - e^{-Tr/T1}). \quad (4)$$

Assuming, for example, $T_1 = 600$ msec (typical of brain tissue at $B_0 = 0.5-1.5$ Tesla) and instrumental timing parameters $T = 80$ msec, $\tau = 10$ msec, $T_r = 97.5$ msec and $\theta = 30°$, Equation (3) predicts $M_x = 0.229$ versus $M_x = 0.129$ by the conventional partial saturation sequence. Likewise, if the pulse repetition time is shortened to $T_r = 47.5$ msec with $T = 20$ msec, $\tau = 10$ msec, and $\theta = 20°$, $M_x$ values of 0.116 and 0.053 are predicted for the pulse sequence according to the invention and conventional partial saturation method, respectively. The latter is consistent with a more than two-fold improvement in signal-to-noise. It will be recognized that a two-fold improvement in signal-to-noise results in a four-fold time saving in the total data collection (e.g., imaging) time. It is essential, however, that in intervals 3, 4, and 5 the length of $\tau$ be kept short. The lower limit of $\tau$ is dictated by the data collection time and decay of the transverse magnetization resulting from the 180° pulse in interval 3.

The effect of the second 180° pulse is also to again reverse the direction of spin dephasing, as indicated by arrow 16, FIG. 1d, to produce a second spin-echo signal (not shown). This signal may be sampled, if desired, to produce a second image or averaged to improve the signal-to-noise ratio. It should also be noted that in order to correct for pulse imperfections (i.e., for pulses which are not exactly 180°), it is advantageous to invert the phase of the second 180° pulse. In this case, the pulse is applied such that its $B_1$ field is directed in the negative X-axis direction (FIG. 1d). The resulting spin echo will be in phase-opposition to that in interval 4, such that if the two spin-echo signals are subtracted the effects of pulse imperfection cancel while the desired signals reinforce. The effects of spurious FID signals due to transverse magnetization produced when the RF pulse is not exactly 180° can be reduced by applying a large magnetic field gradient pulse following the RF pulse to rapidly dephase the transverse magnetization and shorten the spurious FID signal.

Figure 3:
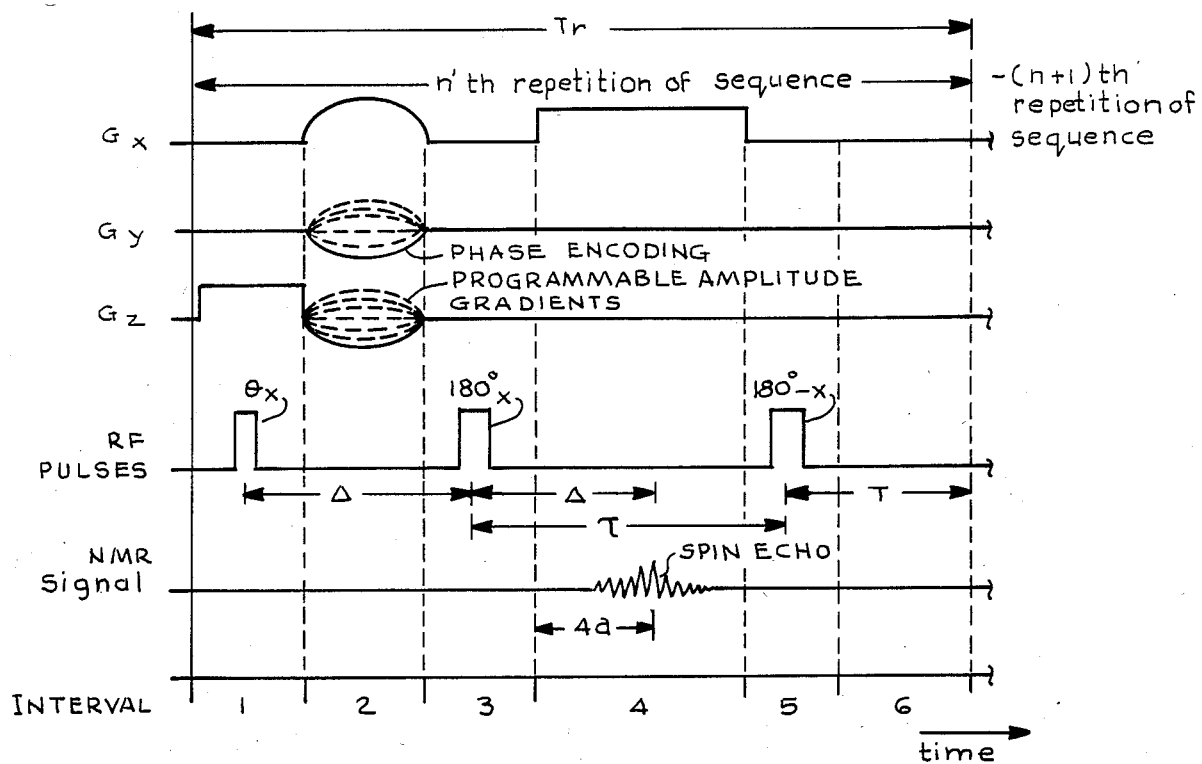
FIG. 3 is similar to FIG. 2 and depicts an exemplary application of the invention to a three-dimensional spin-warp imaging sequence.

Reference is now made to FIG. 3 which depicts another embodiment of the inventive NMR pulse sequence which is the three-dimensional version of the pulse sequence described hereinbefore with reference to FIG. 2. This pulse sequence is substantially identical to that depicted in FIG. 2, but with the notable exception that the selective RF pulse applied in interval 1 of FIG. 3 is selected to have a frequency content so as to preferentially excite nuclear spins in a thicker region of the object undergoing examination. Additionally, the $G_z$ gradient is provided with multiple phase-encoding programmable amplitudes equal in number to the number of slices in which the excited region is to be divided. To this end, the frequency bandwidth of the RF pulse in interval 1 is also determined by the number of slices desired. It should be noted that it is desirable both in FIGS. 2 and 3, but not necessary, to use a selective excitation pulse. For example, the volume may be defined by the geometry of the RF transmitter coil.

The $G_z$ magnetic-field gradient in interval 2 is comprised of two components. The first component is a negative rephasing pulse similar to that applied in interval 2 of FIG. 2 which is necessary to rephase the nuclear spins excited in interval 1. The second gradient component is a phase-encoding pulse which encodes spatial information into the NMR signal arising from the excited region in the Z-axis direction. The $G_z$ gradient is shown in interval 2 as a single phase because the action of the two components is linearly independent and, therefore, can be added to form a single pulse which performs both the rephasing and phase-encoding actions simultaneously.

In using the pulse sequence of FIG. 3 to acquire data, a single amplitude of the $G_z$ phase-encoding gradient is selected and held while the $G_y$ phase-encoding gradient is advanced through a number of amplitudes equal to the number of pixels the reconstructed image is to have in the Y-axis direction. Thereafter, the next amplitude of the $G_z$ gradient is selected and the $G_y$ gradient is then again sequenced through its range of amplitudes. This process is repeated for each of the amplitudes of the $G_z$ gradient. Image pixel data is obtained by utilizing a three-dimensional Fourier transform.

The preferred embodiments of the invention have been described hereinabove with reference to the spin-warp-imaging technique. It will be recognized, however, by those of ordinary skill in the art that the invention may be advantageously practiced with other pulse sequences. One example of such a pulse sequence is the two-dimensional multiple-angle-projection-reconstruction pulse sequence depicted in FIG. 4 which is similar in many respects to that of FIG. 2. As in FIG. 2, a preferably selective excitation RF pulse is applied in interval 1. The pulse is selected, in accordance with the invention, to rotate the longitudinal magnetization through an angle $\theta < 90°$. As before, a 180° pulse is applied in interval 5 to speed up the return of the inverted magnetization ($-M'_z$) to equilibrium.

Figure 4:
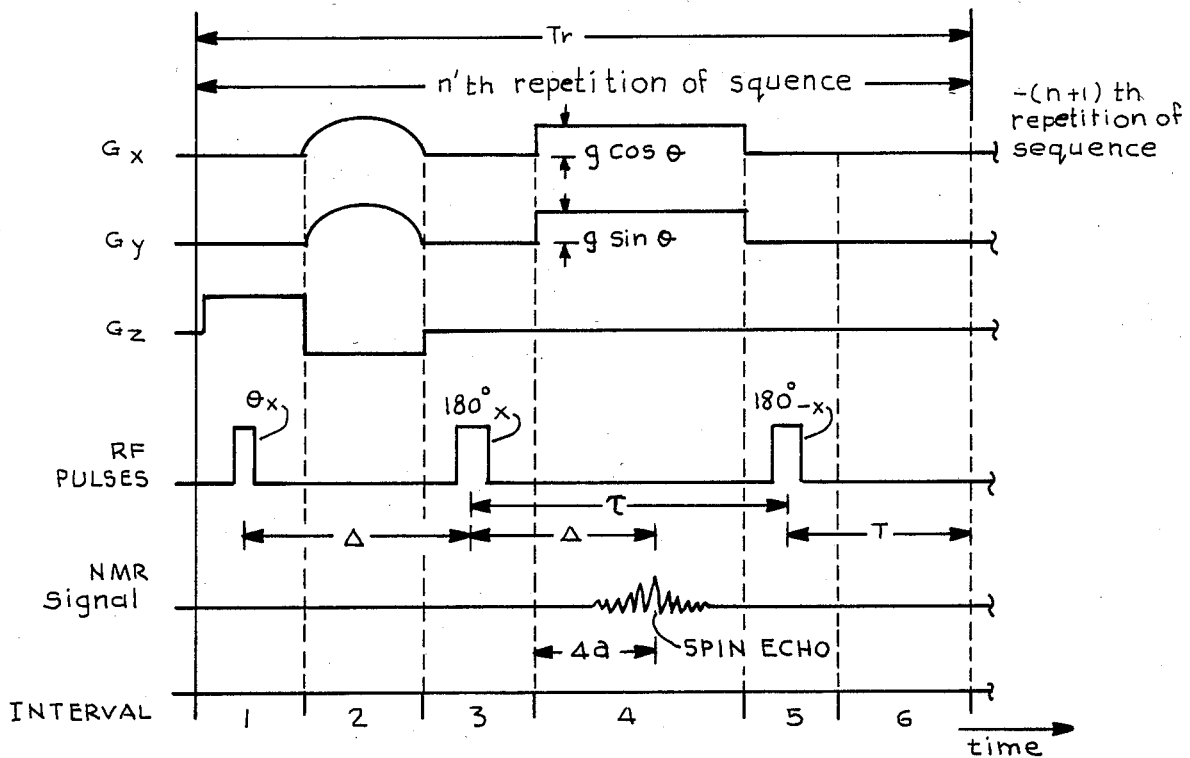
FIG. 4 illustrates as yet another exemplary embodiment of the present invention applied to two-dimensional, multiple-angle projection reconstruction imaging technique.

The primary difference between the pulse sequence of FIG. 4 and that of FIG. 2 is the manner in which spatial information is encoded into the spin-echo signals. This difference will be described in an exemplary manner with reference to the spin-echo signal observed in interval 4. The description is, however, equally applicable to the second spin-echo signal (not shown), if it is sampled to produce a second image as to improve the signal-to-noise ratio. It should be initially noted that the $G_y$ gradient applied in interval 2 is not a phase-encoding gradient but is, rather, a gradient pulse used in combination with the positive $G_x$ gradient pulse (also in interval 2) to time the occurrence of the spin-echo signal in interval 4. To encode spatial information into the spin-echo signal, linear $G_y$ and $G_x$ gradients are applied during interval 4. The $G_x$ and $G_y$ gradients are directed, respectively, in the X- and Y-axis directions within the imaging slice. The magnitudes of the $G_x$ and $G_y$ gradients in interval 4 determine the projection angle $\alpha$. The magnitude of the $G_x$ gradient is made proportional to the sine of the projection angle, while the magnitude of the $G_y$ gradient is made proportional to the cosine of the projection angle. The $G_x$ and $G_y$ gradients add vectorially to produce a resultant gradient in the image plane at a direction $\alpha$. Nuclear spins situated along the direction of the resultant gradient experience different magnetic fields and, therefore, resonate at different frequencies dependent on their position along the gradient which may be ascertained in a well-known manner by Fourier transformation of the spin-echo signal. Fourier transformation of the signal yields the magnitude of the signal at each frequency and, therefore, at each location with respect to the direction of the gradient. The nuclei situated along each line perpendicular to the direction of the gradient have the same resonant frequency. In successive applications (such as the [n+1]th repetition of the sequence), as is necessary in order to obtain sufficient information to image an entire slice, multiple projections are obtained by changing the projection angle by an amount $\Delta\alpha$, typically of the order of 1°, to collect spatial information from 180 projections in at least a 180° arc.

It will be recognized that the pulse sequence depicted in FIG. 4 is the two-dimensional embodiment of the invention utilizing the multiple-angle-projection-reconstruction technique. This pulse sequence can be modified to collect data using a three-dimensional pulse sequence. In this case, a $G_z$ gradient would be applied in interval 4 (FIG. 4) to obtain projections outside of the X-Y plane.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A method for shortening total NMR data acquisition time, comprising the steps of:
   (a) positioning an NMR sample in a homogeneous magnetic field to create in at least a portion thereof a net longitudinal magnetization in a first direction of said homogeneous field, said net longitudinal magnetization having a magnitude $M_z$;
   (b) irradiating said sample with an RF pulse to convert a fraction but not all, of said net longitudinal magnetization to transverse magnetization;
   (c) reversing the direction of dephasing of said transverse magnetization to produce at least one spin-echo signal;
   (d) sampling said spin-echo signal to derive, upon analysis, NMR data from said sample; and
   (e) applying along a dimensional axis of said sample a 180° RF pulse to rapidly return to equilibrium along said first direction of said homogeneous field any remaining net longitudinal magnetization inverted to a second direction, opposite to said first direction, during said step of reversing.

2. The method of claim 1 wherein said step of irradiating comprises applying a selective RF pulse to rotate said longitudinal magnetization away from its alignment with said homogeneous magnetic field through an angle $\theta$ which is selected to be less than 90°, the magnitude of said transverse magnetization being defined by $M_z \sin \theta$.

3. The method of claim 1 wherein said step of reversing comprises irradiating said sample with a 180° RF pulse.

4. The method of claim 1 wherein said step of sampling comprises sampling said spin-echo signal in the presence of at least one magnetic field gradient for encoding spatial information into said spin-echo signal in the direction of said gradient.

5. The method of claim 4 wherein said magnetic-field gradient for encoding information is selected to have one of a plurality of directions within said portion of said sample for each repetition of said steps (b)–(e).

6. The method of claim 5 wherein said gradient for encoding information comprises a resultant magnetic-field gradient of the vertical addition of at least two magnetic-field gradients, which gradients are perpendicular to one another within said sample portion.

7. The method of claim 5 wherein said gradient for encoding information comprises a resultant magnetic-field gradient of the vectorial addition of a plurality of magnetic-field gradients at least one of which is not coplanar with the remaining ones of said plurality of magnetic-field gradients.

8. The method of claim 4 further comprising the step of applying, prior to said step of sampling at least one variable amplitude magnetic-field gradient having one of a plurality of programmable amplitudes for each repetition of steps (b)–(e) to phase-encode spatial information into said spin-echo signal.

9. The method of claim 8 wherein said spin-echo signal is sampled in the presence of a substantially linear magnetic-field gradient, which gradient is perpendicular to the direction of said variable amplitude gradient within said sample portion.

10. The method of claim 9 further comprising the step of applying an additional variable amplitude magnetic field gradient selected to be orthogonal to said one variable amplitude magnetic field gradient, said additional gradient having a plurality of programmable amplitudes; and
holding the amplitude of one of said variable amplitude gradients constant, while sequencing through all of the programmable amplitudes of the other variable amplitude gradient, prior to advancing to the next amplitude of said one gradient.

11. A method for shortening total NMR data acquisition time, comprising the steps of:
   (a) positioning an NMR sample in a homogeneous magnetic field to create in at least a portion thereof a net longitudinal magnetization in a first direction of said homogeneous field, said net longitudinal magnetization having a magnitude $M_z$;
   (b) irradiating said sample with an RF pulse to convert said net longitudinal magnetization to transverse magnetization;
   (c) reversing the direction of dephasing of said transverse magnetization to produce at least one spin-echo signal;
   (d) sampling said spin-echo signal to derive, upon analysis, NMR data from said sample; and
   (e) applying along a dimensional axis of said sample a 180° RF pulse to rapidly return to equilibrium along said first direction of said homogeneous field any remaining net longitudinal magnetization, inverted to a second direction, opposite to said first direction during said step of reversing, prior to repeating said steps (b)–(d).

12. The method of claim 11 wherein said step of irradiating comprises applying a selective RF pulse to rotate said longitudinal magnetization away from its alignment with said homogeneous magnetic field through an angle $\theta$ which is selected to be less than 90°, the magnitude of said transverse magnetization being defined by $M_z \sin \theta$.

13. The method of claim 11 wherein said step of reversing comprises irradiating said sample with a 180° RF pulse.

14. The method of claim 11 wherein said step of sampling comprises sampling said spin-echo signal in the presence of at least one magnetic field gradient for encoding spatial information into said spin-echo signal in the direction of said gradient.

15. The method of claim 14 wherein said magnetic-field gradient for encoding information is selected to have one of a plurality of directions within said portion of said sample for each repetition of said steps (b)–(e).

16. The method of claim 15 wherein said gradient for encoding information comprises a resultant magnetic-field gradient of the vectorial addition of at least two magnetic-field gradients, which gradients are perpendicular to one another within said sample portion.

17. The method of claim 15 wherein said gradient for encoding information comprises a resultant magnetic-field gradient of the vectorial addition of a plurality of magnetic-field gradients at least one of which is not coplanar with the remaining ones of said plurality of magnetic-field gradients.

18. The method of claim 14 further comprising the step of applying, prior to said step of sampling, at least one variable amplitude magnetic-field gradient having one of a plurality of programmable amplitudes for each repetition of steps (b)–(e) to phase-encode spatial information into said spin-echo signal.

19. The method of claim 18 wherein said spin-echo signal is sampled in the presence of a substantially linear magnetic-field gradient, which gradient is perpendicular to the direction of said variable amplitude gradient within said sample portion.

20. The method of claim 19 further comprising the step of applying an additional variable amplitude magnetic field gradient selected to be orthogonal to said one variable amplitude magnetic field gradient, said additional gradient having a plurality of programmable amplitudes; and holding the amplitude of one of said variable amplitude gradients constant, while sequencing through all of the programmable amplitudes of the other variable amplitude gradient, prior to advancing to the next amplitude of said one gradient.

* * * * *

UNITED STATES PATENT AND TRADEMARK OFFICE
CERTIFICATE OF CORRECTION

PATENT NO. : 4,587,489

DATED : May 6, 1986

INVENTOR(S) : Felix W. Wehrli

It is certified that error appears in the above-identified patent and that said Letters Patent is hereby corrected as shown below:

Column 3, line 4, change "comprises" to --comprised--
Column 3, line 43, change "particularly" to --particularity--
Column 8, line 21, delete "phase" and insert --pulse--

Signed and Sealed this

Thirtieth Day of December, 1986

*Attest:*

DONALD J. QUIGG

*Attesting Officer*     *Commissioner of Patents and Trademarks*